United States Patent
Mizushima

Patent Number: 6,084,278
Date of Patent: Jul. 4, 2000

[54] MOSFET WITH GRADIENTLY DOPED POLYSILICON GATE ELECTRODE

[75] Inventor: Kazuyuki Mizushima, Tokyo, Japan

[73] Assignee: NEC Corporation, Tokyo, Japan

[21] Appl. No.: 08/791,030

[22] Filed: Jan. 29, 1997

[30] Foreign Application Priority Data

Jan. 30, 1996 [JP] Japan ................... 8-013823

[51] Int. Cl.[7] ............ H01L 29/76; H01L 29/20
[52] U.S. Cl. .......................... 257/412; 257/520
[58] Field of Search ................. 257/411, 412, 257/413, 344, 408

[56] References Cited

FOREIGN PATENT DOCUMENTS

| | | |
|---|---|---|
| 62-179768 | 8/1987 | Japan . |
| 4-142777 | 5/1992 | Japan . |
| 5-55560 | 3/1993 | Japan . |

Primary Examiner—Wael M. Fahmy
Attorney, Agent, or Firm—Sughrue, Mion, Zinn, Macpeak & Seas, PLLC

[57] ABSTRACT

In a MOSFET having a polysilicon gate electrode, the polysilicon layer of the gate electrode is nonuniformly doped with an impurity for the same type of conductivity as the source and drain regions such that the effective impurity concentration gradually and continuously decreases from a top section toward a bottom section adjacent to the gate oxide film and becomes minimum in the bottom section. When a high voltage is applied between the drain and the gate, a depletion layer is created in the bottom section of the polysilicon layer, whereby the electric field on the gate oxide film is reduced. Accordingly, the thickness of the gate oxide film can be reduced for high-speed operation. Besides, this MOSFET is useful in a high-voltage interface for a MOS circuit operated at a low supply voltage. The doping of the polysilicon layer is accomplished by ion implantation. It is suitable to employ a lightly doped drain (LDD) structure in this MOSFET.

4 Claims, 4 Drawing Sheets

HIGH-SPEED LOGIC   HIGH-VOLTAGE INTERFACE

MOSFET WITH GRADIENTLY DOPED POLYSILICON GATE ELECTRODE

BACKGROUND OF THE INVENTION

This invention relates to a metal-oxide-semiconductor field-effect transistor (MOSFET) in which the gate electrode is essentially a doped polysilicon layer with an impurity concentration gradient in the thickness direction and a method of producing the MOSFET. The impurity concentration gradient in the polysilicon gate electrode is for reducing the electric field on the gate oxide film. On one semiconductor chip, MOSFETs according to the invention can be used in both a high-speed circuit to be operated at a low supply voltage and a high-voltage interface without differentiating the thickness of the gate oxide film.

Device dimensions of MOSFETs have been scaled down for improvements in performance including enhancement of operation speed. According to the scaling rule on MOSFETs, for a K-fold increase in operation speed both the gate length and the gate oxide film thickness should be reduced to 1/K. However, in view of reliability of the device it is impermissible to freely intensify the electric field acting on the gate oxide film. Therefore, when the gate oxide film thickness is reduced to 1/K it is necessary to lower supply voltage to 1/K.

With the developments of microfabrication techniques, MOSFETs of each generation of technology are smaller in size than MOSFETs of the previous generation of technology. However, if different supply voltages are actually employed for devices of different technology generations there arises a problem in a system in which devices of different generations coexist. That is, system components or sub-systems that are operated at different supply voltages cannot be directly connected with each other because of mismatching of input-output levels. To resolve this problem, it is necessary to supplement the system with an extra apparatus or circuit such as a level shifter or to provide a buffer circuit for matching input-output levels within the system.

For example, let's suppose that an IC including a MOS logic circuit which is operated at a supply voltage of 3.3 V is to be directly connected with another semiconductor circuit operated at a voltage of 5 V. In the low-voltage logic circuit the thickness of the gate oxide film must be 10–12 nm, but an output part of the IC needs to include a buffer circuit using output MOSFETs in which the gate oxide film thickness is about 15 nm. That is, it is necessary to form two gate oxide films different in thickness on a single substrate. So, two different oxidation steps are needed, and two photolithographic steps are needed to select the areas for the respective gate oxide films. Naturally the fabrication process becomes very complicated.

Meanwhile, JP-A 5-55560 (1993) proposes to substantially reduce the intensity of electric field acting on the gate oxide film of a MOSFET by evading direct application of supply voltage to the gate oxide film. More particularly, the proposal is a polysilicon (polycrystalline silicon) gate electrode having a two-layer structure with different impurity concentrations.

FIG. 5 of the accompanying drawings shows a MOSFET according to JP-A 5-55560. For example, the MOSFET in FIG. 5 is a p-channel MOSFET. A gate oxide film 52 lies on an n-type semiconductor substrate 50, and p⁺-type source and drain regions 54 and 56 are formed in the substrate 50. A gate electrode 58 on the gate oxide film 52 is formed of doped polysilicon and has a two-layer structure consisting of a lower polysilicon layer 58a in which the impurity concentration is relatively low and an upper polysilicon layer 58b in which the impurity concentration is relatively high. In FIG. 5, a drain voltage $V_D$, which is a positive and relatively high voltage, is applied to the drain region 56. The gate electrode is negatively biased by a gate voltage $V_G$. The source region is kept at ground potential. In this state, a depletion layer 60 is created in the lightly doped polysilicon layer 58a in a region close to the drain region 56 by the action of the high drain voltage $V_D$. As a result, the potential difference between the drain and gate, $V_D+V_G$, is divided by a capacitance of the gate oxide film 52 and another capacitance of the depletion layer 60, and therefore an effective electric field acting on the gate oxide film 52 is reduced.

However, this two-layer structure of the polysilicon gate electrode has disadvantages with respect to the fabrication process. It is necessary to perform two polysilicon deposition steps and two doping steps. Besides, when the lower polysilicon layer 58a is formed by chemical vapor deposition as is usual, it is necessary to deposit polysilicon at least to a thickness of about 50 nm for accurately controlling the thickness, though a thinner layer is desirable. As a result, the total thickness of the two polysilicon layers is liable to become greater than a desirable thickness a gate electrode, and therefore difficulties arise in precise patterning of the polysilicon layers. Furthermore, in the case of fabricating MOSFETs shown in FIG. 5 and MOSFETs of a different gate electrode structure to be operated at a relatively low supply voltage on a single substrate, different process steps are needed for the two kinds of MOSFETs.

SUMMARY OF THE INVENTION

It is an object of the present invention to provide a MOSFET of relatively simple structure in which the electric field on the gate oxide film is reduced so that the thickness of the gate oxide film can be reduced even though supply voltage is not proportionally lowered.

From another aspect, an object of the invention is to provide a MOSFET which is suitable for use in an interface between a high-speed MOS circuit on the same substrate and another semiconductor circuit operated at a higher supply voltage.

It is another object of the invention to provide a method of producing a MOSFET according to the invention.

A MOSFET according to the invention comprises a gate oxide film formed on a principal surface of a semiconductor substrate of first conductivity, a gate electrode which comprises a polysilicon layer formed on the gate oxide film, and source and drain regions of opposite second conductivity which are formed in a surface section of the substrate on two opposite sides of the gate electrode, respectively. According to the invention, the polysilicon layer of the gate electrode is doped with impurity atoms for the second conductivity such that the effective concentration of the impurity atoms gradually and continuously decreases from a top section toward a bottom section adjacent to the gate oxide film and becomes minimum in the bottom section.

It is preferable that a MOSFET according to the invention has a lightly doped drain (LDD) structure, which is well known.

In a MOSFET according to the invention, a depletion layer is created in the bottom section of the polysilicon layer of the gate electrode when a relatively high voltage is applied between the drain and the gate electrode, and therefore the electric field on the gate oxide film is reduced.

The invention is useful in improving operation speed of MOSFET by reducing the thickness of the gate oxide film.

On the other hand, a MOSFET according to the invention can be operated at a relatively high supply voltage even though the thickness of the gate oxide film is reduced. Therefore, by using the invention it is easy to fabricate a high-speed circuit to be operated at a relatively low supply voltage and a high-voltage interface circuit on a single semiconductor chip, because MOSFETs of the same structure and of equal gate oxide film thickness can be used in both circuits.

In producing a MOSFET according to the invention, the doping of the polysilicon layer of the gate electrode and the formation of the source and drain regions are simultaneously accomplished by ion implantation of an impurity element.

When the MOSFET employs a LDD structure, the polysilicon gate electrode is lightly doped at the stage of forming a relatively shallow and lightly doped drain layer (and a similarly shallow and lightly doped source layer) in the substrate. The lightly doped drain and source layers are self-aligned so as to partly intrude into a gate area under the polysilicon gate electrode. Then, dielectric sidewalls are formed on two opposite sides of the polysilicon gate electrode as is usual in the fabrication of LDD structure. After that, ion implantation is performed to form relatively deep and heavily doped source and drain layers in the substrate and to simultaneously heavily dope the polysilicon gate electrode. The heavily doped source and drain layers are self-aligned so as not to extend into the aforementioned gate area. The ion implantation is followed by suitable annealing for activation of the implanted impurity. The implantation conditions are controlled so as to realize the desired impurity concentration gradient in the polysilicon gate electrode. It is an option to relatively lightly dope the polysilicon gate electrode with an impurity for the opposite type of conductivity before introducing the impurity used for forming the lightly doped drain and source layers.

DESCRIPTION OF THE PREFERRED EMBODIMENTS

Figure 1A:
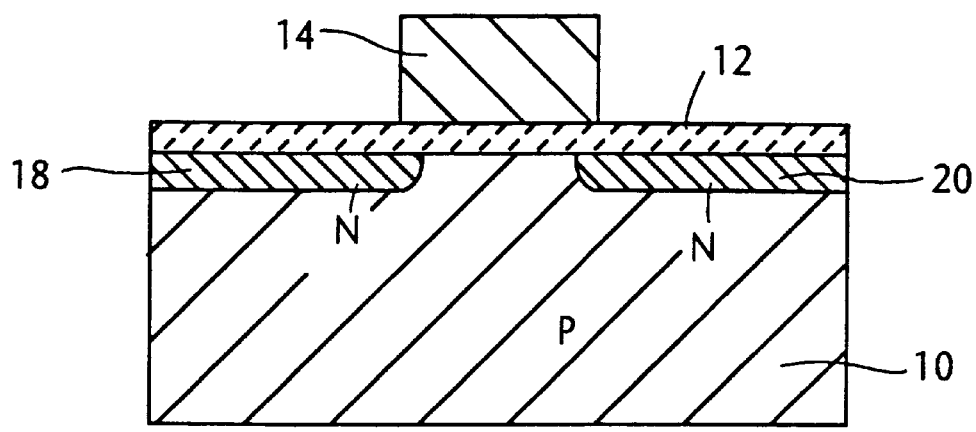
FIGS. 1(A) and 1(B) illustrate, in schematic cross-sectional views, a process of producing a MOSFET embodying the invention.
Figure 1B:
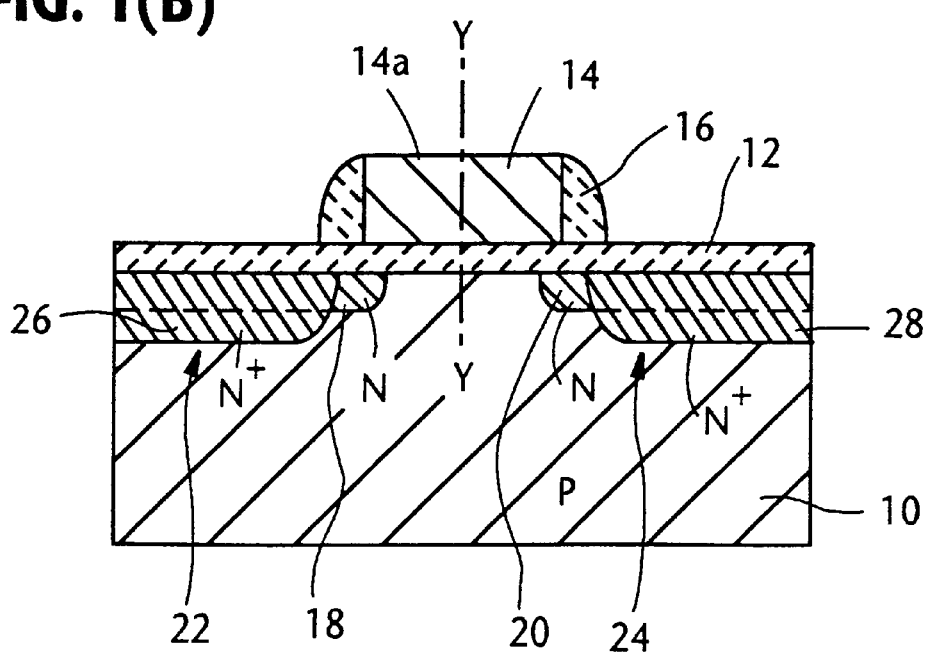

As an embodiment of the invention, FIG. 1(B) shows the structure of an n-channel MOSFET according to the invention. A gate oxide film 12 lies on a p-type semiconductor substrate 10, and in a gate region a gate electrode 14 is formed on the gate oxide film 12. Essentially the gate electrode 14 is a polysilicon layer which is doped with n-type impurity (donor). In this polysilicon layer 14 there is an impurity concentration gradient in the thickness direction such that the concentration of n-type impurity atoms is relatively high in a top section near the top surface 14a and becomes lowest in a bottom section adjacent to the gate oxide film 12.

This MOSFET employs a LDD structure. So, sidewalls 16 of silicon oxide are formed on the side faces of the gate electrode 14. In the substrate 10 under the oxide film 12, there are n-type source and drain regions 22, 24 on the two opposite sides of the gate region. The source region 22 consists of a heavily doped ($n^+$-type) and relatively deep layer 26 and a lightly doped (n-type) and relatively shallow layer 18. Similarly, the drain region 24 consists of a heavily doped and relatively deep layer 28 and a lightly doped and relatively shallow layer 20. In plan view of the MOSFET, the gate elctrode 14 partly overlaps the lightly doped layers 18, 20 of the source and drain regions but does not overlap the heavily doped layers 26, 28. Toward the gate region, the heavily doped layers 26 and 28 each terminate at a vertical plane which is close to the intersection of the surface of the sidewall 16 on the gate electrode 14 and the surface of the gate oxide film 12.

For example, a MOSFET of the structure shown in FIG. 1(B) is produced by the following process.

Referring to FIG. 1(A), on a principal surface of a p-type silicon substrate 10, a silicon oxide film 12 to use as the gate oxide film is formed by a thermal oxidation method. The thickness of the oxide film 12 is controlled, for example, to 10–12 nm. Next, the gate electrode 14 is formed by first forming a non-doped polysilicon layer having a thickness of 150–200 nm on the oxide film 12 and then patterning the polysilicon layer into the desired shape of the gate electrode. After that, as an n-type impurity, ions of phosphorus (P) are implanted into the gate electrode 14 and the p-type silicon substrate 10. In a preferred case, the implantation energy is about 30 keV, and the implantation dose is about $1 \times 10^{14}$ $cm^{-2}$. After that, annealing is performed in nitrogen gas atmosphere at about 900° C. for about 10 min. The annealing causes diffusion of implanted phosphorus in the entire volume of the polysilicon electrode 14 and results in a nearly uniform distribution of phosphorus atoms in the electrode 14. In this example, the concentration of phosphorus atoms in the polysilicon electrode 14 becomes about $8 \times 10^{18}$ $cm^{-3}$. On both sides of the gate electrode 14, phosphorus ions enter the silicon substrate 10 through the oxide film 12 to form relatively shallow and lightly doped n-type layers 18 and 20. Side edge regions of the gate electrode 14 overlap edge regions of these lightly doped layers 18 and 20.

Next, referring to FIG. 1(B), sidewalls 16 are formed on the side faces of the gate electrode 14 by first depositing a silicon oxide film to a thickness of about 100 nm over the entire area of the oxide film 12 and the gate electrode 14 by a chemical vapor deposition technique and then performing etch-back of the deposited oxide film by an anisotropic eching technique such as reactive ion etching (RIE). After that, ions of arsenic (As), which is an n-type impurity, are implanted into the gate electrode 14 and the silicon substrate 10. For example, the implantation energy is about 50 keV, and the implantation dose is 2 to $4 \times 10^{15}$ $cm^{-2}$ By this ion implantation the concentration of n-type impurity atoms in the gate electrode 14 is increased, and simultaneously relatively deep $n^+$-type layers 26 and 28 are formed in the substrate 10 to provide source and drain regions 22 and 24. The oxide side walls 16 on the gate electrode 14 serve as masks to prevent the $n^+$-layers 26, 28 from intruding into the gate region under the polysilicon electrode 14. The relatively shallow and lightly doped layers 18 and 20 remain in the areas under the sidewalls 16 and edge regions of the gate electrode 14. The implanted impurities are activated by a suitable annealing method such as rapid thermal annealing (RTA). According to the need, a heat treatment may be made in a furnace tube.

Figure 2:
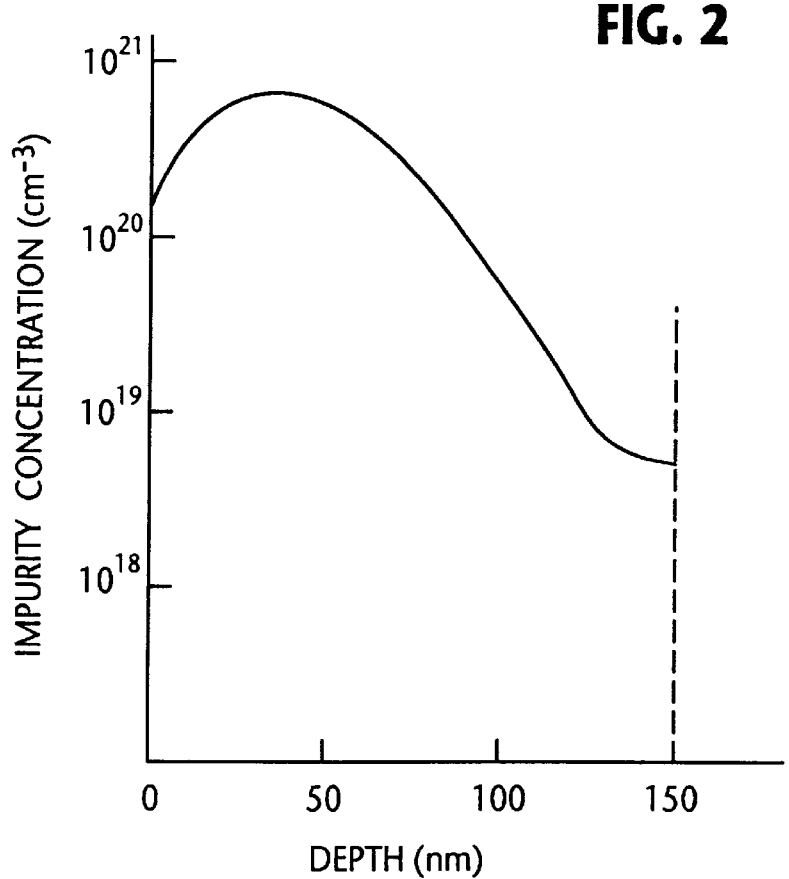
FIG. 2 is a graph showing the impurity profile in the polysilicon gate electrode of the MOSFET in FIG. 1(B)

In a MOSFET produced by the above process, the impurity concentration profile in the gate electrode 14 in the section Y—Y in FIG. 1(B) was as shown in FIG. 2. The thickness of the gate electrode 14 was 150 nm. In a top section near the-top surface 14a the impurity concentration is very high and reaches $1\times10^{20}$ to $1\times10^{21}$ cm$^{-3}$, but in the remaining sections the impurity concentration gradually and continuously decreases as the distance from the top surface 14a increases. In a bottom section adjacent to the gate oxide film 12 the impurity concentration falls to a minimum which is $8\times10^{18}$ to $1\times10^{19}$ cm$^{-3}$.

Figure 3:
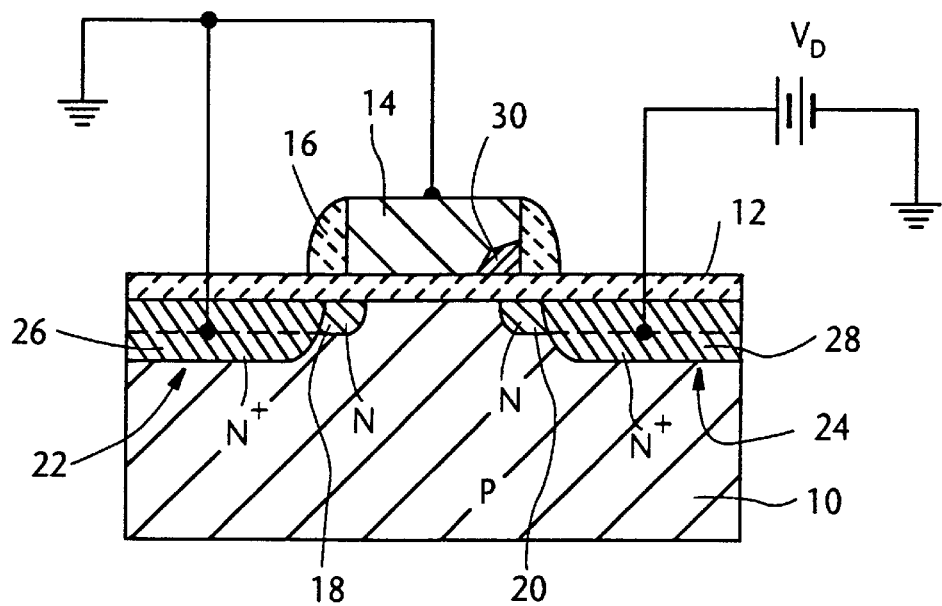
FIG. 3 is an illustration of the operation of the MOSFET in FIG. 1(B)

The operation of the MOSFET of FIG. 1(B) will be described with reference to FIG. 3. It is assumed that the MOSFET in FIG. 3 is used in an interface between a high-speed MOS logic circuit operated at a supply voltage of 3.3 V and another circuit for which the supply voltage is 5 V. In the MOSFETs in the high-speed logic circuit the thickness of the gate oxide film is assumed to be 11 nm, and the thickness of the gate oxide film 12 in FIG. 3 is also 11 nm.

In FIG. 3, a drain voltage $V_D$ of 5 V (positive voltage) is applied to the heavily doped layer 28 of the drain 24 while the source 22 and the gate electrode 14 are kept at ground potential. In a bottom section of the gate electrode 14 near the gate oxide film 12, the impurity concentration is $8\times10^{18}$ to $1\times10^{19}$ cm$^{-3}$ as described above. Under these conditions, a depletion layer 30 is created in the bottom section of the gate electrode 14 in an area where the gate electrode 14 overlaps the lightly doped drain layer 20. The depletion layer 30 is in contact with the gate oxide film 12 and has a thickness of about 10 nm. The gate oxide film 12 provides a capacitor, and the depletion layer 30 provides another capacitor, and these two capacitors are connected in series. So, the drain voltage (supply voltage) $V_D$, which is 5 V in this case, is divided by these two capacitors. When the depletion layer 30 is 10 nm in thickness, a voltage of about 3.8 V acts on the gate oxide film 12 and about 1.2 V on the depletion layer 30. Thus, a voltage fairly lower than the drain voltage $V_D$ is applied to the gate oxide film 12. Therefore, the thinness of the gate oxide film 12 offers no problem in operating the MOSFET.

Figure 4A:
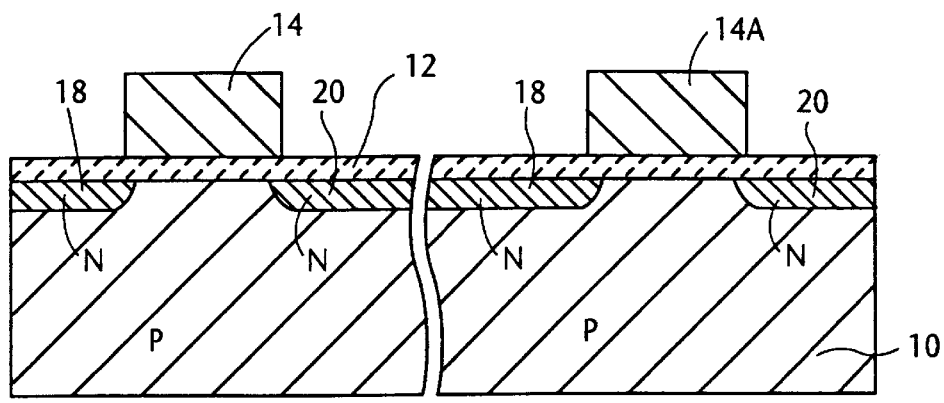
FIGS. 4(A) and 4(B) illustrate, in schematic cross-sectional views, a process of producing the MOSFET shown in FIG. 1(B) and another MOSFET according to the invention on a single substrate.
Figure 4B:
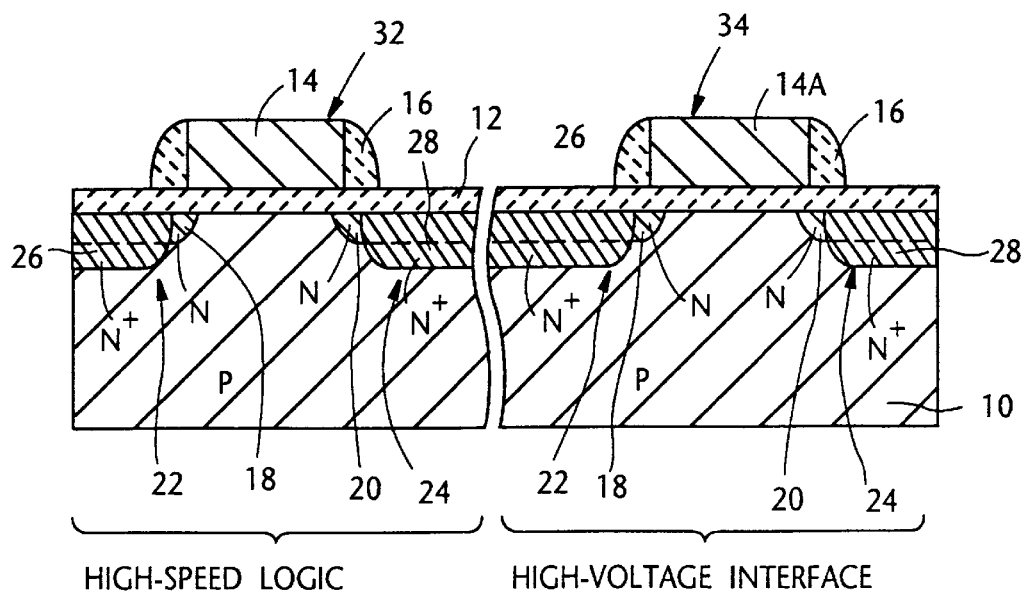
Figure 5:
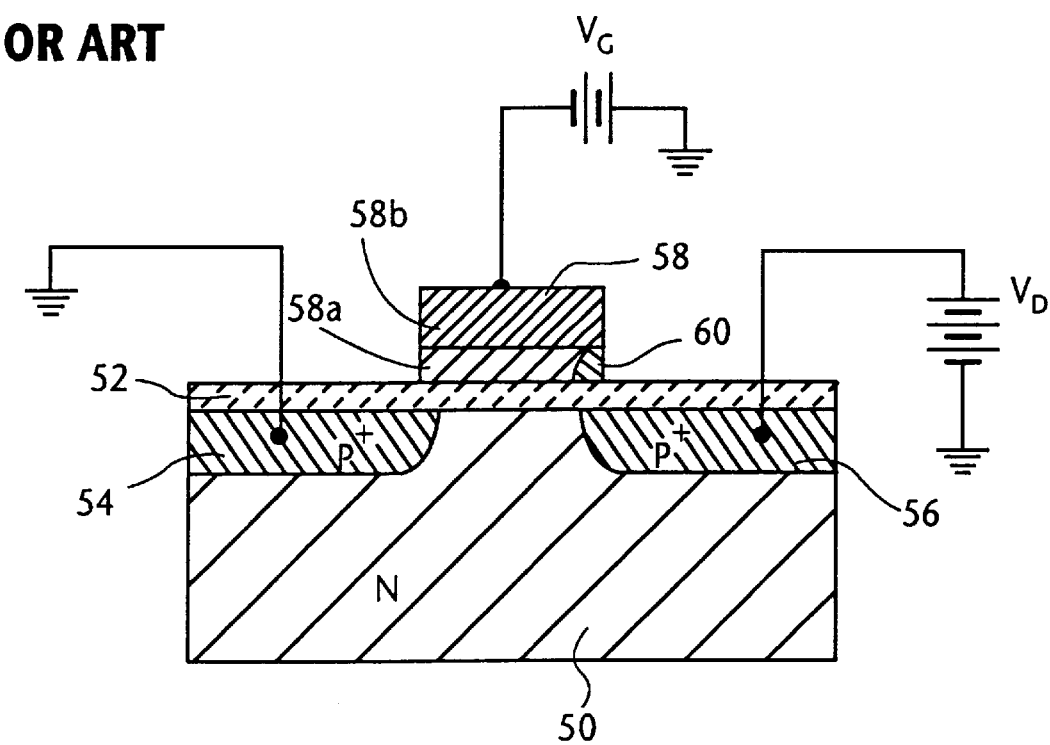
FIG. 5 illustrates the structure and operation of a known MOSFET in a schematic cross-sectional view.

As a second embodiment of the invention, FIGS. 4(A) and 4(B) show the fabrication of two dissimilar MOSFETs 32 and 34 on a single substrate. The MOSFET 32 is for a high-speed logic circuit which is operated at a relatively low supply voltage and the MOSFET 34 is for a high-voltage interface to connect the high-speed logic circuit with another circuit operated at a relatively high supply voltage. For example, the two transistors 32, 34 are n-channel MOSFETs. The MOSFET 32 is identical with the MOSFET shown in FIG. 1(B). The MOSFET 34 differs from the MOSFET 32 only in the manner of impurity doping of the gate electrode 14A.

Referring to FIG. 4(A), a silicon oxide film 12 on a p-type silicon substrate 10 is used as the gate oxide film of both MOSFETs 32, 34. On the oxide film 12, two gate electrodes 14 and 14A of non-doped polysilicon are formed for the two MOSFETs 32 and 34, respectively. Then, only the polysilicon electrode 14A is doped with a p-type impurity element (acceptor) such as boron so as to have a nearly uniform impurity concentration of about $5\times10^{18}$ cm$^{-3}$. After that, phosphorus ions (n-type impurity) are implanted into the silicon substrate 10 and the two gate electrodes 14 and 14A, and the ion implantation is followed by annealing. The implantation and annealing conditions are as described with reference to FIG. 1(A). As a result, relatively shallow and lightly doped n-type layers 18 and 20 are formed in the substrate 10 for each of the two MOSFETs 32 and 34.

Next, as shown in FIG. 4(B), sidewalls 16 of silicon oxide are formed on the side faces of both gate electrodes 14 and 14A. After that, arsenic ions (n-type impurity) are implanted into the silicon substrate 10 and the gate electrodes 14 and 14A, and the implanted impurities are activated. These processings are as described with reference to FIG. 1(B). As a result, relatively deep and heavily doped n$^+$-type layers 26 and 28 are formed in the source and drain regions 22 and 24 of both MOSFETs 32 and 34, and n-type impurity concentrations in the gate electrodes 14, 14A of both MOSFETs 32, 34 increase.

In the MOSFET 32 for the logic circuit, the heavily doped gate electrode 14 reduces gate resistance and therefore enables high-speed operation of this MOSFET 32. In the MOSFET 34 for the high-voltage interface, the effective concentration of n-type impurity atoms in the gate electrode 14A becomes very low in a bottom section adjacent to the gate oxide film 12 because of the existence of the initially introduced p-type impurity (such as boron). Therefore, in operation of this MOSFET 34 the bottom section of the gate electrode 14A is very susceptible to depletion in an area overlapping the lightly doped layer 20 of the drain 24, and for this reason a high voltage applied to the drain 24 does not directly act on the thin gate oxide film 12.

What is claimed is:

1. A metal-oxide-semicondcutor field-effect transistor (MOSFET), comprising a gate oxide film formed on a principal surface of a semiconductor substrate of first conductivity, a gate electrode which comprises a polysilicon layer formed on the gate oxide film, and source and drain regions of opposite second conductivity which are formed in a surface section of the substrate on two opposite sides of the gate electrode, respectively, wherein said polysilicon layer of the gate electrode is doped with impurity atoms of the second conductivity such that the effective concentration of said impurity atoms gradually and continuously decreases from a top section toward a bottom section adjacent to said gate oxide film and becomes minimum in said bottom section.

2. A MOSFET according to claim 1, wherein the drain region comprises a relatively deep and heavily doped drain layer which lies outside of a gate area under said polysilicon layer of the gate electrode and a relatively shallow and lightly doped drain layer which is contiguous to said heavily doped layer and partly overlaps said gate area.

3. A MOSFET according to claim 2, wherein the source region comprises a relatively deep and heavily doped source layer which lies outside of said gate area and a relatively shallow and lightly doped source layer which is contiguous to said heavily doped source layer and partly overlaps said gate area.

4. A MOSFET according to claim 1, wherein said polysilicon layer of the gate electrode is relatively lightly doped with an impurity element of the first conductivity and relatively heavily doped with at least one impurity element of the second conductivity.

* * * * *